(12) United States Patent
Nickel et al.

(10) Patent No.: US 6,400,600 B1
(45) Date of Patent: Jun. 4, 2002

(54) METHOD OF REPAIRING DEFECTIVE TUNNEL JUNCTIONS

(75) Inventors: Janice H. Nickel; Thomas C. Anthony, both of Sunnyvale, CA (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/675,775

(22) Filed: Sep. 30, 2000

(51) Int. Cl.[7] .............................................. G11C 11/14
(52) U.S. Cl. ...................................... 365/171; 365/173
(58) Field of Search ................................ 365/171, 173, 365/148, 158, 170

(56) References Cited

U.S. PATENT DOCUMENTS

| | | | | |
|---|---|---|---|---|
| 5,640,343 A | * | 6/1997 | Gallagher et al. | 365/171 |
| 6,097,625 A | * | 8/2000 | Scheuerlein | 365/171 |
| 6,183,859 B1 | * | 2/2001 | Chen et al. | 428/332 |
| 6,201,259 B1 | * | 3/2001 | Sato et al. | 257/30 |
| 6,211,559 B1 | * | 4/2001 | Zhu et al. | 257/421 |
| 6,261,646 B1 | * | 7/2001 | Chen et al. | 427/531 |

* cited by examiner

*Primary Examiner*—Richard Elms
*Assistant Examiner*—Anh Phung

(57) ABSTRACT

A typical MRAM device includes an array of memory cells, each memory cell includes a spin dependent tunneling junction. The defective tunnel junction may be repaired by voltage-exercising the tunnel junction. Nominal resistance of defective tunnel junction is increased by a voltage-exercising method. The voltage-exercising method is performed by applying one or more voltage cycles to the defective tunnel junction.

19 Claims, 4 Drawing Sheets

METHOD OF REPAIRING DEFECTIVE TUNNEL JUNCTIONS

BACKGROUND OF THE INVENTION

The present invention relates to devices having thin dielectric barriers. More specifically, the present invention relates to tunnel junctions including, but not limited to, spin dependent tunneling ("SDT") junctions. The invention also relates to information storage devices including, but not limited to, Magnetic Random Access Memory ("MRAM") devices.

A typical MRAM device includes an array of memory cells, word lines extending along rows of the memory cells, and bit lines extending along columns of the memory cells. Each memory cell is located at a cross point of a word line and a bit line.

In one type of MRAM device, each memory cell includes an SDT junction. The magnetization of an SDT junction assumes one of two stable orientations at any given time. These two stable orientations, parallel and anti-parallel, represent logic values of '0' and '1.' The magnetization orientation, in turn, affects the resistance of the SDT junction. Resistance of the SDT junction is a first value (R) if the magnetization orientation is parallel and a second value (R+ΔR) if the magnetization orientation is anti-parallel.

The magnetization orientation of an SDT junction and, therefore, its logic state may be read by sensing its resistance state. However, the memory cells in the array are coupled together through many parallel paths. The resistance seen at one cross point equals the resistance of the memory cell at that cross point in parallel with resistances of memory cells in the other rows and columns. In this regard, the array of memory cells may be characterized as a cross point resistor network.

An SDT junction has an insulating tunnel barrier that is only a few atoms thick. Controlling the fabrication process to produce such thin barriers for an entire array of memory cells is difficult. Some SDT junctions will have a nominal resistance that is significantly lower than the design value. SDT junctions having a significantly low nominal resistance will be referred to as "defective" SDT junctions.

An SDT junction having a significantly low nominal resistance is unusable in an MRAM device. The defective SDT junction can cause a bit error. In a resistive cross point array that does not use switches or diodes to isolate memory cells from one another, the other SDT junctions in the same column and row as the defective SDT junction will also be rendered unusable. Thus, a single defective SDT junction can cause a column-wide error and a row-wide error.

When data is read back from the MRAM device, error code correction may be used to recover data from a complete column or row of unusable SDT junctions. However, correcting a thousand or more bits in a single column or row is costly, both from a time standpoint and a computational standpoint. Moreover, an MRAM device is likely to have more than one defective SDT junction.

Therefore, a need exists to overcome the problems associated with defective SDT junctions in resistive cell cross point memory arrays.

SUMMARY OF THE INVENTION

According to one aspect of the present invention, a defective tunnel junction may be repaired by voltage-exercising the tunnel junction. Other aspects and advantages of the present invention will become apparent from the following detailed description, taken in conjunction with the accompanying drawings, illustrating by way of example the principles of the invention.

DETAILED DESCRIPTION OF THE INVENTION

Figure 1:
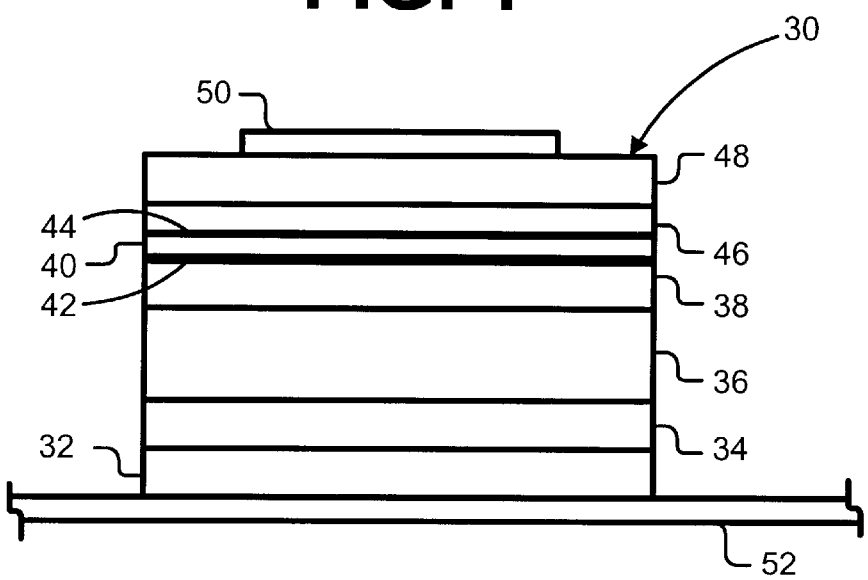
FIG. 1 is an illustration of an SDT junction.

As shown in the drawings for purposes of illustration, the present invention is embodied in an SDT junction having an insulating tunnel barrier. If the junction has a nominal resistance that is significantly lower than its intended design value, that junction can be "repaired" by voltage-exercising. Voltage-exercising may be performed by applying one or more voltage cycles to the junction. Multiple cycles may be applied until the nominal resistance of the junction has stabilized. Although the nominal resistance of the repaired junction might still be lower than the intended design value, it will not be significantly lower than the intended design value. And even if the repaired junction is not usable, it will not affect other cells in a column or row. Thus, the repaired junction will not cause column-wide and row-wide errors. At worst, it will only cause a bit error. The bit error is less costly to correct by error code correction.

Reference is made to FIG. 1, which illustrates an SDT junction 30 including a multi-layer stack of materials. The stack includes first and second seed layers 32 and 34. The first seed layer 32 allows the second layer 34 to be grown with a (111) crystal structure orientation. The second seed layer 34 establishes a (111) crystal structure orientation for a subsequent antiferromagnetic ("AF") pinning layer 36. The AF pinning layer 36 provides a large exchange field, which holds the magnetization of a subsequent pinned (bottom) ferromagnetic ("FM") layer 38 in one direction. Atop the pinned FM layer 38 is an insulating tunnel barrier 40. Optional interfacial layers 42 and 44 may sandwich the insulating tunnel barrier 40. Atop the insulating tunnel barrier 40 is a sense (top) FM layer 46 having a magnetization that is free to rotate in the presence of an applied magnetic field. A protective capping layer 48 is atop the sense FM layer 46. A protective dielectric (not shown) surrounds the stack.

The first seed layer 32 and the protective capping layer 48 may be made of titanium (Ti) or tantalum (Ta), and the second seed layer 34 may be made of nickel-iron (NiFe). The AF pinning layer 36 may be made of manganese-iron (MnFe), nickel manganese (NiMn), nickel oxide (NiO) or iridium-manganese (IrMn). The FM layers 38 and 46 may be made of NiFe, or iron oxide ($Fe_3O_4$), or chromium oxide ($CrO_2$) or cobalt alloys (e.g., CoFe), or other ferromagnetic or ferrimagnetic materials. The interfacial layers 42 and 44 may be made of iron (Fe). Other materials may be used for the interfacial layers 42 and 44, although a high spin polarized material is desirable. The insulating tunnel barrier 40 may be made of aluminum oxide ($Al_2O_3$), silicon dioxide ($SiO_2$), tantalum oxide ($Ta_2O_5$) or silicon nitride ($SiN_4$).

Other dielectrics and certain semiconducting materials may be used for the insulating tunnel barrier 40.

The SDT junction 30 is formed between first and second ohmic contacts 50 and 52. The ohmic contacts 50 and 52 may be made of a conductive material such as copper, aluminum or gold or alloys thereof.

The insulating tunnel barrier 40 allows quantum mechanical tunneling to occur between the pinned and sense layers 38 and 46. This tunneling phenomenon is electron spin dependent, making the resistance of the SDT junction 30 a function of the relative orientations of the magnetization of the pinned and sense layers 38 and 46.

Resistance of an SDT junction 30 may be a first (nominal) value (R) if the magnetization orientation of the pinned and sense layers 38 and 46 is parallel. Resistance of the memory cell 12 may be increased to a second value (R+ΔR) if the magnetization orientation is changed from parallel to anti-parallel. An exemplary nominal resistance (R) may be about one Megaohms. An exemplary change in resistance (ΔR) may about 30% to 40% of the nominal resistance (R).

Defects in the insulating tunnel barrier 40 can reduce the nominal resistance (R) of the junction 30. For instance, the defects might cause pinhole conduction or resonant conduction.

As a result of these defects, a defective junction 30 might have a nominal resistance that is several orders of magnitude lower than the nominal resistance of a junction 30 that is not defective. For example, the nominal resistance of the defective junction might be only 5 Kohms, and the change in resistance (ΔR) might be only 8% of the nominal resistance (R). Distinguishing one resistance state from the other would be difficult for such a low change in resistance (ΔR).

However, the defective junction 30 may be repaired by voltage-exercising. The voltage-exercising may be performed by applying one or more voltage cycles across the ohmic contacts 50 and 52. The voltage cycles increase the nominal resistance (R) of the junction 30. Multiple voltage cycles may be applied until the nominal resistance of the junction 30 has stabilized at a new value.

The repaired junction 30 might not be restored to the nominal resistance (R) of a non-defective junction, but it can be restored to a new nominal resistance that is within one order of magnitude of the nominal resistance of the non-defective junction. Moreover, the change in resistance (ΔR) of the repaired junction 30 is increased. For example, the nominal resistance (R) of the repaired junction 30 might be increased to 100 Kohms and the change in resistance (ΔR) might be increased to 20% of the new nominal resistance (R).

The voltages may be ramped up to a maximum voltage over successive cycles. In the alternative, the maximum voltage may be applied to the junction 30 over successive cycles. Maximum voltage applied across the ohmic contacts 50 and 52 is greater than a read voltage, but it is less than the breakdown voltage of the junction 30.

There is no limitation on the number of cycles or the waveform of the cycles. Multiple voltage cycles are preferably applied until the nominal resistance of the junction 30 has stabilized. Stability may be determined by measuring the nominal resistance of the junction 30 after each cycle is applied.

Figure 2A:
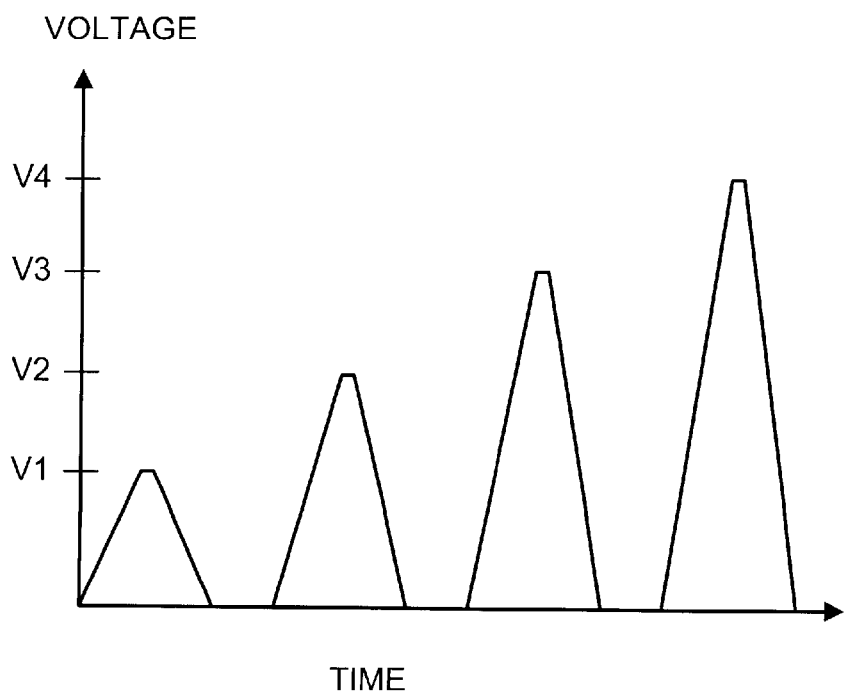
FIGS. 2a, 2b, 2c and 2d are illustrations of exemplary voltage profiles for voltage-exercising the SDT junction.
Figure 2B:
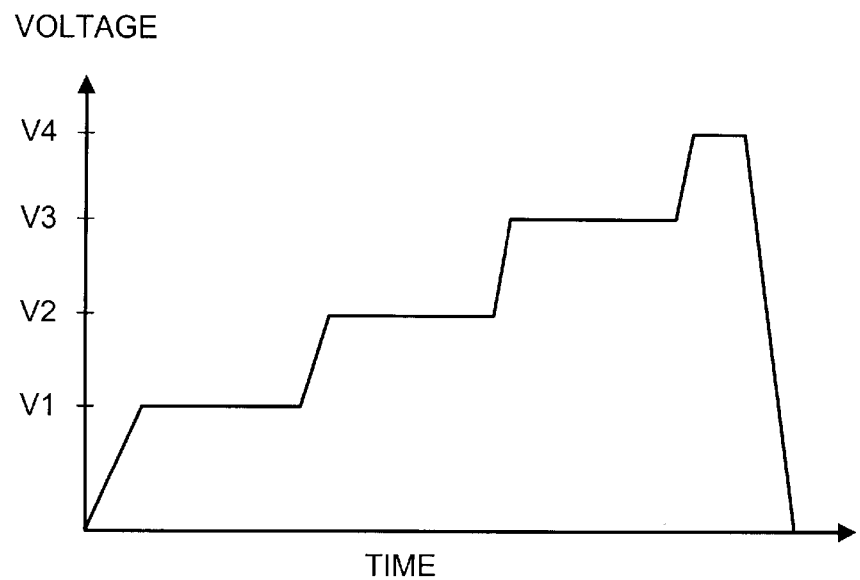
Figure 2C:
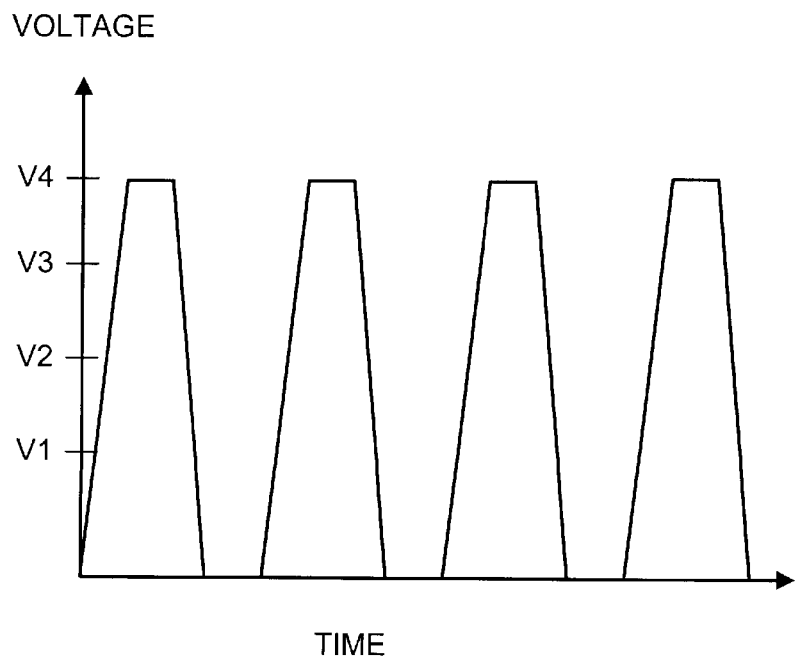

For each cycle, the voltage may be brought up quickly and dropped quickly, the voltage may be brought up and held (a new cycle would begin by bringing up the voltage to a higher level), the voltage may be pulsed (that is brought up quickly, held and dropped quickly), etc. There is no limitation on the duration of each cycle or on the rate at which a voltage is brought up or dropped. FIGS. 2a, 2b, 2c and 2d show different exemplary profiles for the voltage-exercising. Although FIGS. 2a to 2c show that only four voltage cycles are applied during voltage-exercising, fewer or more than four cycles may be applied during the voltage-exercising.

FIG. 2a shows a first exemplary profile for voltage-exercising the junction 30. A first voltage (V1) is applied to the junction 30 and removed during a first cycle; a second voltage (V2) is applied and removed during a second cycle; a third voltage (V3) volts is applied and removed during a third cycle; and a maximum voltage (V4) is applied and removed during a fourth cycle.

For example, a defective junction has breakdown voltage of about 1.8 to 2 volts. To repair the defective junction, voltage cycles following the profile of FIG. 2a are applied across the ohmic contacts 50 and 52. The first voltage (V1) may be 0.25 volts, the second voltage (V2) may be 0.65 volts, the third voltage (V3) may be 1.05 volts, and the fourth voltage (V4) may be 1.5 volts. For the repaired junction, resistance states may be sensed by applying a read voltage of about 0.5 volts across the ohmic contacts 50 and 52.

FIG. 2b shows a second exemplary profile. The voltage applied across the junction 30 is brought up quickly and held at a first voltage (V1), increased quickly and held at a second voltage (V2), increased quickly and held at a third voltage (V3), increased quickly and held at the maximum voltage (V4), and then dropped.

FIG. 2c shows a third exemplary profile. Instead of ramping up the voltage to the maximum voltage (V4), the same maximum voltage (V4) is applied over multiple cycles. The maximum voltage (V4) is applied in pulses.

Figure 2D:
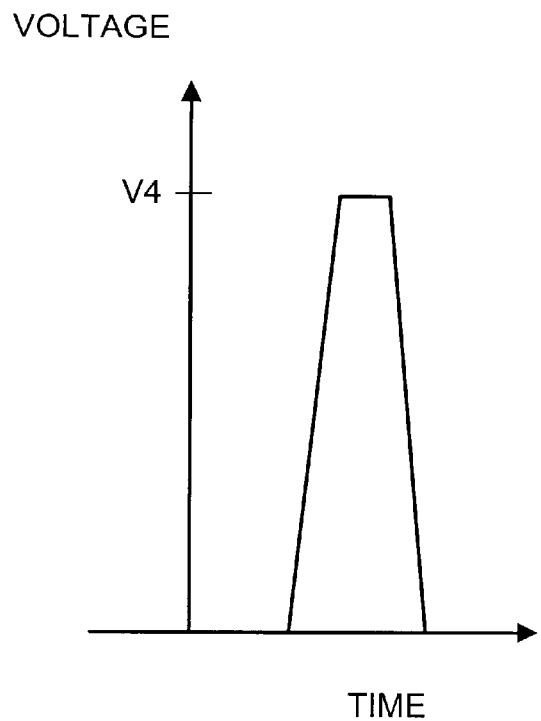

FIG. 2d shows a fourth exemplary profile. A maximum voltage (V4) is applied in a single cycle.

Figure 3:
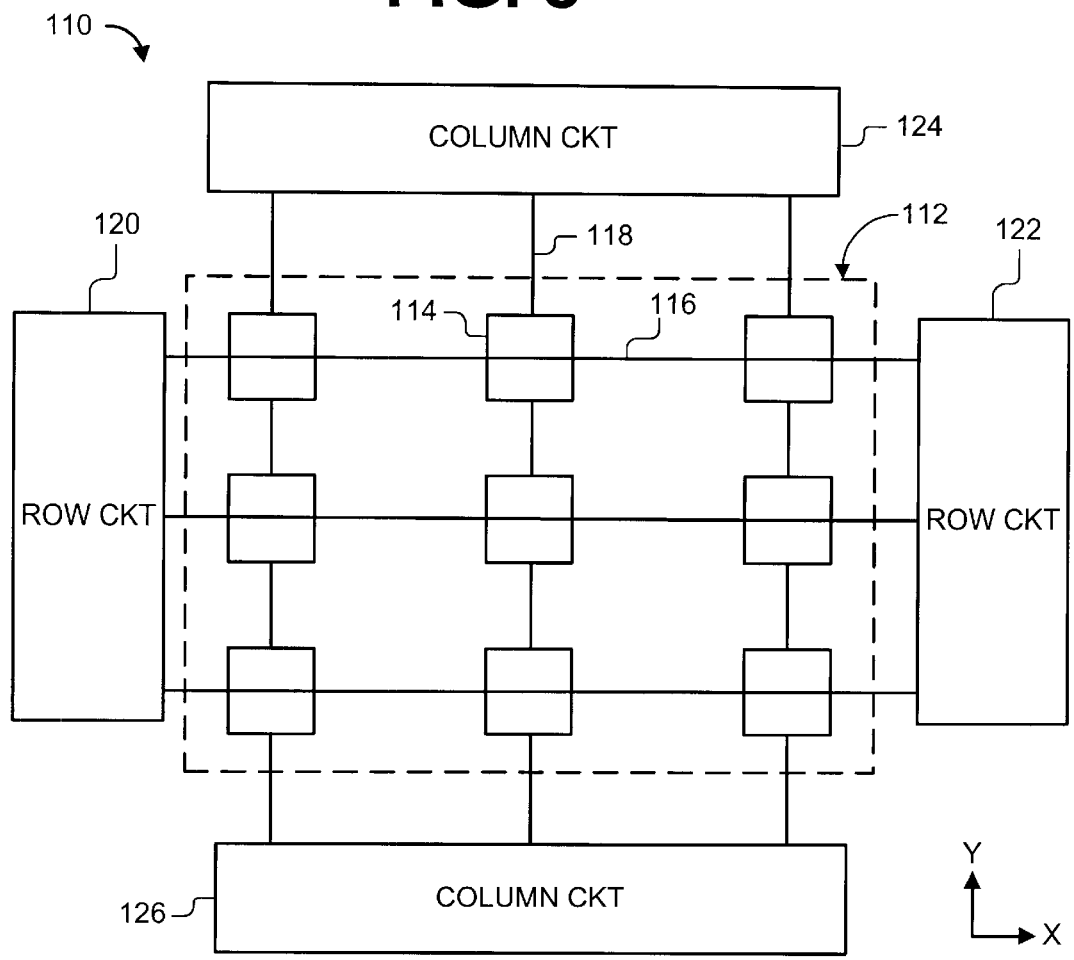
FIG. 3 is an illustration of an MRAM device according to the present invention.

Reference is now made to FIG. 3, which illustrates an MRAM device 110 including an array 112 of tunnel junction memory cells 114. The memory cells 114 are arranged in rows and columns, with the rows extending along an x-direction and the columns extending along a y-direction. Only a relatively small number of memory cells 114 are shown to simplify the description of the device 110. In practice, arrays of any size may be used.

Traces functioning as word lines 116 extend along the x-direction in a plane on one side of the memory cell array 112. Traces functioning as bit lines 118 extend along the y-direction in a plane on an opposite side of the memory cell array 112. There may be one word line 116 for each row of the array 112 and one bit line 118 for each column of the array 112. Each tunnel junction memory cell 114 is formed between a word line 116 and a bit line 118. Thus, each tunnel junction memory cell 114 is at a cross point of a word line 116 and bit line 118. The word and bit lines 116 and 118 provide ohmic contacts to the tunnel junction of the memory cell 114 (in place of the ohmic contacts 50 and 52 shown in FIG. 1).

The device 110 further includes read and write circuits (represented by first and second row circuits 120 and 122 and first and second column circuits 124 and 126) for applying read and write potentials to selected memory cells 114 during read and write operations. To generate the read and write currents, the first and second row circuits 120 and 122 apply appropriate potentials to the word lines 116, and the first and second column circuits 124 and 126 apply appropriate potentials to the bit lines 118.

The second column circuit 126 also includes sense amplifiers for sensing the resistance states of the selected memory cells 114. The stored logic values may be read by sensing the resistance states.

The device 110 does not include transistors or diodes for blocking sneak path currents during read operations. Instead, an operating potential is applied to a selected bit line and an equal operating potential is applied to a subset of unselected lines (e.g., the unselected bit lines). This "equipotential method" allows the sense current to be read reliably without the use of diodes or switches for blocking the sneak path currents. The "equipotential" method is disclosed in assignee's U.S. Pat. Ser. No. 09/564,308 filed Mar. 3, 2000.

Either the read circuit or the write circuit may be configured to apply the voltage-exercising voltages to defective memory cells 114. Either the read circuit or the write circuit may ground one of the lines crossing a defective memory cell and apply the voltage-exercising voltage profile to the other line crossing the defective memory cell. Multiple defective cells may be repaired simultaneously.

Figure 4:
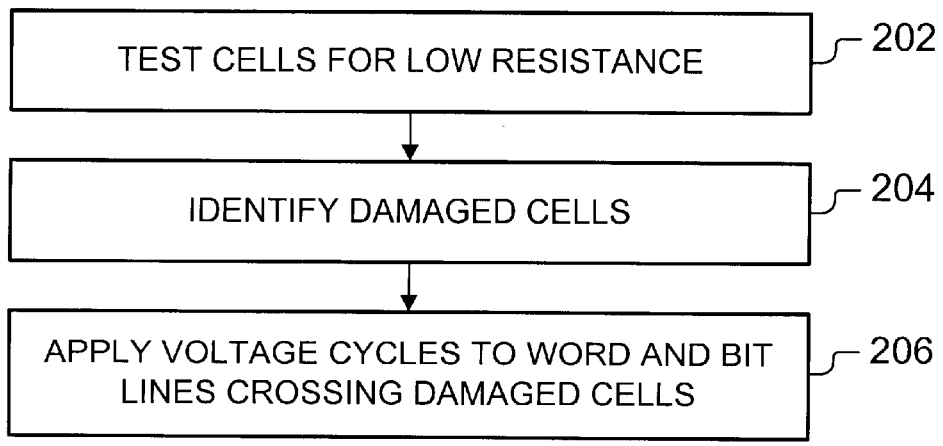
FIG. 4 is an illustration of a first method of repairing defective tunnel junctions.

FIG. 4 illustrates a first method of repairing defective tunnel junction memory cells 114 in the MRAM device 110. Following fabrication of the device 110, the memory cells 114 are tested for low nominal resistances (block 202). Memory cells having "dead" junctions (i.e., junctions having a nominal resistance of less than about 25 ohms), are not repaired. Only memory cells 114 having defective junctions are identified (block 204).

The tunnel junction of each identified memory cell is voltage-exercised by applying voltage cycles to the word and bit lines 116 and 118 crossing the identified cell (block 206). During each cycle, the row and column circuits 120 to 126 apply cycles of voltage-exercising voltages to the crossing word and bit lines 116 and 118.

After each cycle, the resistance of the defective junction may be checked. Checking the resistance provides an indication of when the nominal resistance has stabilized.

The sense amplifier might be able to distinguish resistance states of memory cells having repaired tunnel junctions. Even if it can't, however, the memory cells having repaired tunnel junctions will not cause column-wide or row-wide errors, only bit errors. The bit errors are less costly to correct.

Figure 5:
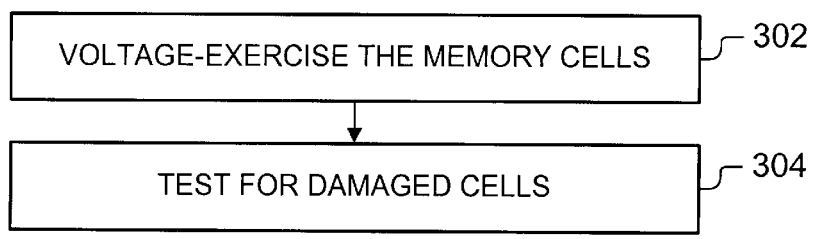
FIG. 5 is an illustration of a second method of repairing defective tunnel junctions.

FIG. 5 illustrates a second method of repairing defective tunnel junction memory cells 114 in the MRAM device 110. Following fabrication of the device 110, all of the memory cells 114 in the array 112 are voltage-exercised (block 302). Voltage cycles may be applied simultaneously to the memory cells 114. The voltage cycles do not damage the junctions. Testing for defective memory cells 114 may be performed after the voltage cycles are applied (block 304).

The methods of FIGS. 4 and 5 may be performed at the wafer level or package level.

Other configurations may be used in an SDT junction. For example, a hard magnet or a synthetic antiferromagnet may be used instead of an AF pinning layer. The AF pinning layer may be placed near the top of the stack instead of the bottom of the stack, whereby the top FM layer is the pinned layer and the bottom FM layer is the sense layer.

The tunnel junctions are not limited to SDT junctions. Other types of tunnel junctions, magnetic or otherwise, having thin dielectric barriers may be used.

The present invention is not limited to the specific embodiments described and illustrated above. Instead, the present invention is construed according to the claims that follow.

What is claimed is:

1. A method of increasing resistance of a tunnel junction, the method comprising applying a plurality of voltage cycles to the junction, maximum voltage being less than a breakdown voltage of the junction.

2. The method of claim 1, wherein the voltages are ramped up over successive cycles to the maximum voltage.

3. The method of claim 1, wherein the cycles are applied until nominal resistance of the memory cell has stabilized.

4. A method of increasing resistance of a tunnel junction, the method comprising applying a single voltage cycle to the junction, voltage of the cycle being less than a breakdown voltage of the junction.

5. A method of repairing a spin dependent tunneling device having an insulating tunnel barrier, the method comprising applying a plurality of voltage cycles across the junction, maximum voltage being less than breakdown voltage of the junction.

6. The method of claim 5, wherein the voltages are ramped up over successive cycles.

7. A method of repairing a plurality of tunnel junctions in an MRAM device, the tunnel junctions being crossed by word line and bit lines, the method comprising:

using word and bit lines crossing the tunnel junctions to apply at least one voltage cycle to each tunnel junction of the plurality, maximum voltage being less than a breakdown voltage of the junctions.

8. The method of claim 7, the device including a read/write circuit, wherein the read/write circuit is used to apply the voltages to the word and bit lines.

9. The method of claim 8, wherein maximum voltage is greater than a read voltage provided by the read/write circuit.

10. The method of claim 7, further comprising testing the device for memory cells having defective tunnel junctions, and then applying the voltage cycles to the word and bit lines crossing the defective junctions.

11. The method of claim 7, wherein at least one voltage cycle is applied to each tunnel junction in the array, the voltage cycles being applied simultaneously to the plurality of tunnel junctions.

12. An MRAM device comprising:

an array of memory cells, each memory cell including a tunnel junction;

a plurality of word lines extending along memory cell rows of the array;

a plurality of bit lines extending along memory cell columns of the array; and a circuit for applying voltage-exercising voltages to the word and bit lines.

13. The device of claim 12, wherein the tunnel junctions are spin dependent tunneling junctions.

14. The device of claim 12, wherein the circuit is a write circuit.

15. The device of claim 12, wherein the circuit is a read circuit.

16. The device of claim 12, wherein maximum voltages during the voltage-exercising is less than tunnel junction breakdown voltage and greater than read voltage.

17. The device of claim 12, wherein multiple voltage cycles are applied to each cell under repair, the voltage cycles being ramped up to a maximum voltage, the maximum voltage being less than tunnel junction breakdown voltage.

18. The device of claim 12, wherein the voltage-exercising voltages are applied only to defective memory cells.

19. The device of claim 12, wherein the voltage-exercising voltages are applied simultaneously to all of the memory cells.

* * * * *